(12) United States Patent
Kanamitsu et al.

(10) Patent No.: US 6,991,878 B2
(45) Date of Patent: Jan. 31, 2006

(54) PHOTOMASK REPAIR METHOD AND APPARATUS

(75) Inventors: Shingo Kanamitsu, Kawasaki (JP); Takashi Hirano, Kawasaki (JP); Fumiaki Shigemitsu, Yokohama (JP); Motosuke Miyoshi, Tokyo (JP); Kazuyoshi Sugihara, Miura-gun (JP); Yuichiro Yamazaki, Tokyo (JP); Makoto Sekine, Yokohama (JP); Takayuki Sakai, Chofu (JP); Ichiro Mori, Yokohama (JP); Katsuya Okumura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 14 days.

(21) Appl. No.: 10/326,112

(22) Filed: Dec. 23, 2002

(65) Prior Publication Data

US 2003/0215722 A1 Nov. 20, 2003

(30) Foreign Application Priority Data

Dec. 27, 2001 (JP) ....................................... 2001-398182

(51) Int. Cl.
*G03F 9/00* (2006.01)
*G03C 5/00* (2006.01)

(52) U.S. Cl. .......................................... 430/5; 430/296
(58) Field of Classification Search ...................... 430/5, 430/296; 250/492.2, 492.3; 216/63, 67
See application file for complete search history.

(56) References Cited

U.S. PATENT DOCUMENTS

| 4,906,326 A | * | 3/1990 | Amemiya et al. ............. 430/5 |
| 5,482,802 A | | 1/1996 | Celler et al. |
| 5,582,939 A | * | 12/1996 | Pierrat ............................ 430/5 |
| 6,090,507 A | * | 7/2000 | Grenon et al. ................. 430/5 |
| 6,593,040 B2 | * | 7/2003 | Smith ............................. 430/5 |
| 2002/0088940 A1 | * | 7/2002 | Watanabe et al. ........... 250/310 |
| 2003/0047691 A1 | * | 3/2003 | Musil et al. ............. 250/492.2 |

FOREIGN PATENT DOCUMENTS

| JP | 3-100655 | 4/1991 |
| JP | 5-100407 | 4/1993 |
| JP | 06-079470 | 10/1994 |
| JP | 2000-010260 | 1/2000 |
| WO | WO00/63946 | 10/2000 |

* cited by examiner

*Primary Examiner*—S. Rosasco
(74) *Attorney, Agent, or Firm*—Finnegan, Henderson, Farabow, Garrett & Dunner, L.L.P.

(57) ABSTRACT

A photomask repair method including scanning an electron beam across a main surface of the photomask, thereby producing a pattern image of the photomask, identifying the position of a defective portion from the pattern image thus produced, and applying an electron beam to a region to be etched including a defective portion under an atmosphere of a gas capable of performing a chemical etching of a film material forming the photomask pattern, thereby removing a defect. In this method, the electron beam to be applied to the region to be etched is a shaped beam. The electron beam is set such that the side of the electron beam is applied in parallel to a borderline between a non-defective pattern and the defect.

18 Claims, 4 Drawing Sheets

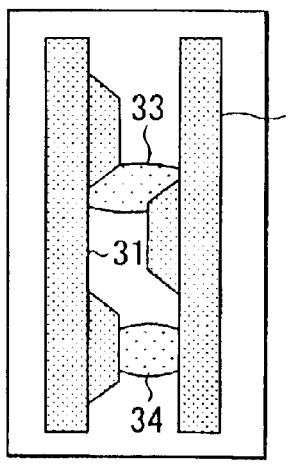
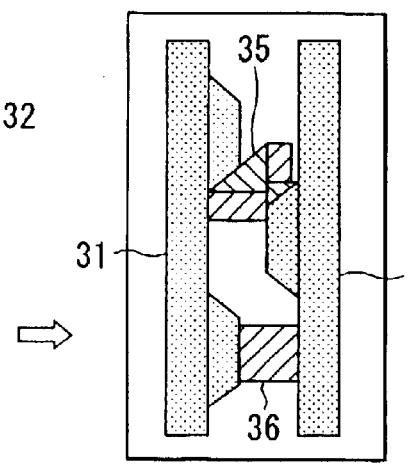
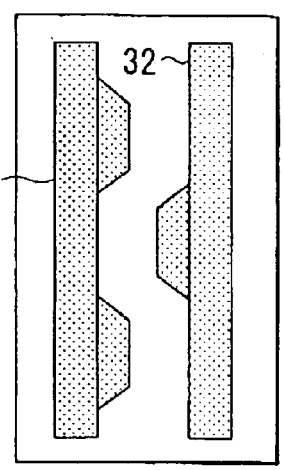
FIG. 3A    FIG. 3B    FIG. 3C
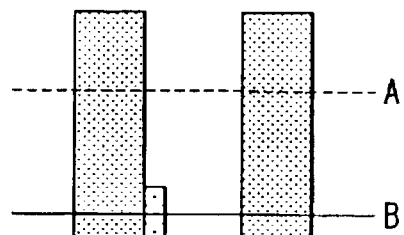
FIG. 5A
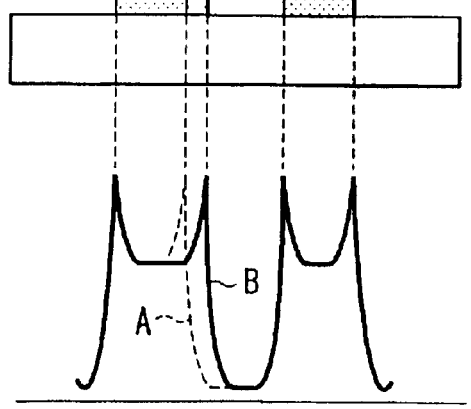
FIG. 5B
FIG. 5C

PHOTOMASK REPAIR METHOD AND APPARATUS

CROSS-REFERENCE TO RELATED APPLICATIONS

This application is based upon and claims the benefit of priority from prior Japanese Patent Application No. 2001-398182 filed Dec. 27, 2001, and the entire content of which is incorporated herein by reference.

BACKGROUND OF THE INVENTION

1. Field of the Invention

The present invention relates to a technique for repairing defects formed in a photomask, and more particularly, to a repair method and apparatus for repairing defects such as projections (black defects) extending off a pattern.

2. Description of the Related Art

Conventionally, to repair a micro pattern formed in the photomask, a converged ion beam repair apparatus, which employs gallium as an ion source, has been used. Repair is performed by the apparatus in the following procedure:

(1) An appropriate region of a photomask around a defect is scanned with an ion beam and secondary electrons or secondary ions emitted from the photomask are detected to form an image;

(2) The size and position of the defect on the formed image and the positional relationship between the defect and a non-defective pattern are identified; and (3) the defect is irradiated with a beam while an appropriate etching gas is supplied.

In the step (1), an ion beam must be injected into the peripheral region of several $\mu$m around the defect to be repaired even though the peripheral region is not defective. If gallium ions are implanted in a light transmissible portion (glass portion) of the photomask, "gallium stain" is produced, which decreases light transmittance. In short, if gallium ions are implanted excessively, the transferred image on a wafer may sometimes be negatively affected. Therefore, irradiation must not be performed in excess of a standard dose.

It is known that the effect of the gallium stain increases as the wavelength of light emitted from light-emitting device decreases. More specifically, as the light-emitting device comes to employ an ArF laser ($\lambda$: 193 nm) in place of a KrF laser ($\lambda$: 248 nm), the permissible dose for obtaining an image decreases. Furthermore, when a laser of the next generation, F2 laser ($\lambda$: 157 nm), comes to be used, even a trace amount of gallium ions influences the image-transfer. It follows that such a gallium ion beam may not be used in practice.

If a defect is repaired but the repair is not made accurately in position, the defect must be re-repaired. However, because of the gallium-stain, the number of re-repair operations is limited. This problem takes place when any generation (type) of laser is used. In addition, in the step (3), since gallium ions are implanted into the underlying substrate of the defect, the effect of such gallium ions cannot be ignored. This phenomenon is caused by overetching.

To overcome these problems, it has been proposed that an electron beam should be used in place of an ion beam. However, the method of scanning a thin-converged electron beam lengthwise and crosswise, as is often performed in the ion optical system has a problem in that the etching rate is low compared to a method of scanning an excited ion beam. The low-etching rate problem can be overcome by increasing the beam size or the pixel size for beam scanning. However in this case, if the beam is applied along a edge of diagonal pattern, the edge of the pattern is processed in a zigzag fashion to form a stepped portion. When the beam is applied along a linear pattern, if the width of the pattern is not equal to an integral multiple of a pixel size, overetching or underetching occurs by at most a half-pixel-size.

The profiles are shown in FIGS. 8A to 8C. FIG. 8A shows that defects 83 and 84 are present between adjacent patterns 81 and 82. A rectangular beam 85 is scanned across the defects 83 and 84 to remove them, as shown in FIG. 8B. As a result, edge-roughness is produced as shown in FIG. 8C. The edge-roughness problem can be overcome by minimizing the beam size and a pixel size for beam scanning; however, the etching rate becomes low. The intrinsic problem to an electron beam is not overcome.

As described above, an electron beam may be used in place of an ion beam to remove defects (black defects) formed in a photomask. Since the etching rate of the electron beam is lower than that of the ion beam, extremely long time is required for repairing the defects. Conversely, if the size of electron beam is enlarged, and edge roughness is produced along a diagonal pattern (line).

BRIEF SUMMARY OF THE INVENTION

According to a first aspect of the invention, there is provided a photomask repair method for repairing a defect of a photomask, comprising:

scanning an electron beam across a main surface of the photomask, and detecting electrons emitted from the main surface of the photomask by scanning the beam, thereby producing a pattern image of the photomask;

identifying the position of a defective portion of the photomask from the pattern image thus produced; and etching the defective portion by applying an electron beam composed of shaped beams, which are formed through beam shaping apertures and projected to the main surface of the photomask, to a region to be etched including the defective region, under an atmosphere of a gas capable of effectively performing chemical etching of a film material for forming a pattern of the photomask, such that a side of the beam is applied in parallel to the boarder line between a non-defective pattern and the defect.

According to a second aspect of the invention, there is provided a photomask repair method for repairing a defect of a photomask; comprising:

applying an electron beam shaped trough a beam-shaping aperture to a region to be etched including a defective portion of the photomask under an atmosphere of a gas capable of effectively performing a chemical etching of a film material for forming a pattern of the photomask, thereby etching the defective portion;

scanning the electron beam converged to be fine across a predetermined area around the defective portion, thereby permitting secondary electrons to emit to produce a pattern image, obtaining an electron intensity profile in the perpendicular direction to an edge of the pattern image produced above, thereby identifying the position of the profile corresponding to an end of the defective portion; and performing repair of the photomask while performing etching and identification, repeatedly, and terminating the etching when the edge of the defective portion reaches a proper position.

According to a third aspect of the present invention, there is provided a repair apparatus for repairing a defect of a photomask, comprising:

a chamber which houses the photomask;

a gas inlet mechanism which introduces an etching gas into the chamber;

an electron-detecting portion which detects secondary electrons and reflection electrons emitted from a main surface of the photomask by scanning an electron beam across the surface of the photomask;

a pattern image formation portion which forms a pattern image of the photomask based on information brought by the detected electrons; and a beam irradiation mechanism which applies an electron beam composed of shaped beams, which are formed through beam shaping apertures and projected to the main surface of the photomask, to a region to be etched including the defective region obtained from the pattern image produced above such that a side of the beam is set in parallel to the boarder line between a non-defective pattern and the defect.

According to a fourth aspect of the present invention, there is provided a repair apparatus for repairing a defect of a photomask, comprising:

a chamber which houses the photomask;

a gas inlet mechanism which introduces an etching gas into the chamber;

an electron-detecting portion which detects secondary electrons or reflection electrons emitted from a surface of the photomask by scanning an electron beam across the surface of the photomask;

a pattern image formation portion which forms a pattern image of the photomask based on information brought by the detected electrons; and a beam irradiation mechanism which applies a shaped beam to a defective portion obtained from the pattern image thus formed, in which monitoring by electron-beam scanning and etching by shaped-beam irradiation are alternately repeated, a non-defective edge position and a defective edge position are identified from the pattern image during the monitoring, and etching is terminated when a repaired edge position reaches a proper position.

BRIEF DESCRIPTION OF THE SEVERAL VIEWS OF THE DRAWING

FIGS. 3A to 3C shows a repair procedure by the VSB system;

FIGS. 5A to 5C shows a procedure how to detect a pattern-image;

DETAILED DESCRIPTION OF THE INVENTION

Now, the present invention will be described in more detail by way of examples.

(First Embodiment)

An object of the present invention is to provide a photomask repair method and apparatus capable of removing a defect of a photomask by an electron beam and forming a photomask at a high etching rate without producing edge roughness.

Figure 1:
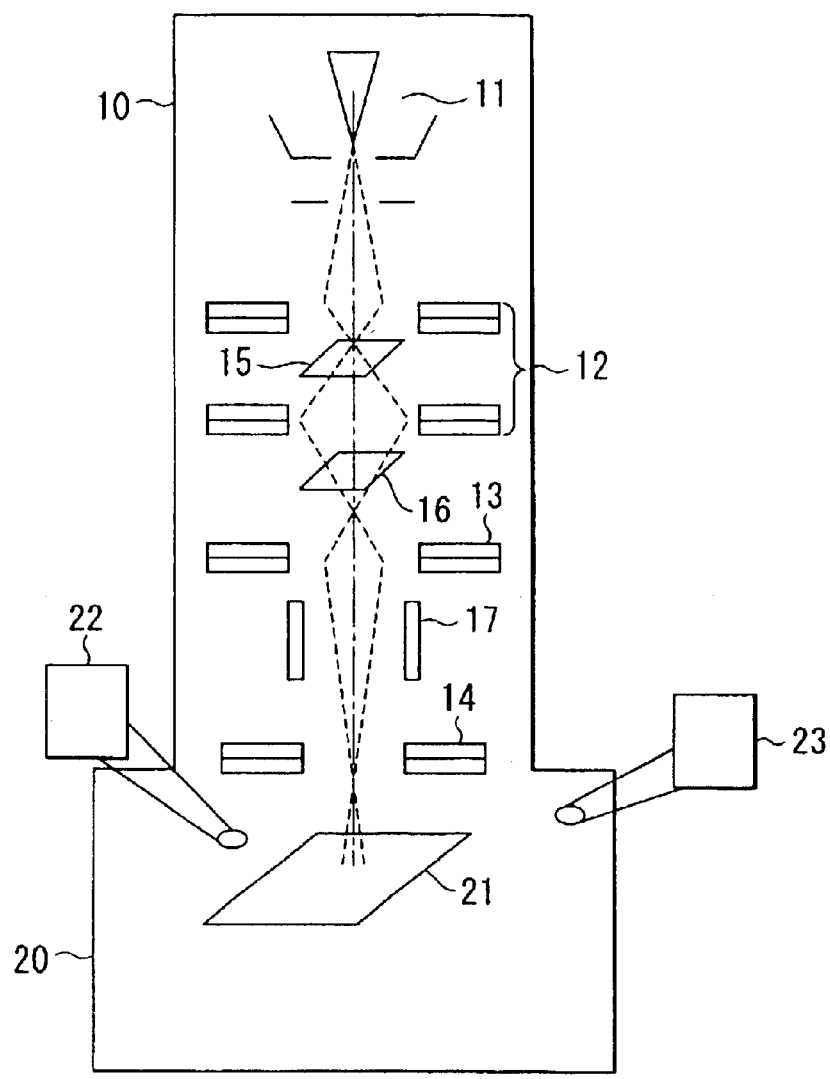
FIG. 1 is a schematic view showing a structure of a pattern-defect repair apparatus according to a first embodiment.

FIG. 1 is a schematic view of a photomask defect repair apparatus according to a first embodiment of the present invention. The apparatus is composed of an electro optical system 10 and a chamber 20 mutually connected. The electro optical system 10 houses an electron gun 11, converging lens 12, reducing lens 13, object lens 14, shaping apertures 15 and 16, and deflection electrode 17. The chamber 20 houses a stage (not shown) for mounting a photomask 21 thereon.

The basic structure of the photomask defect repair apparatus is the same as that of a conventional electron beam emitting apparatus. The apparatus of this embodiment is further equipped with the following structure elements in the chamber 20: an electronic detection unit 22 for detecting secondary electrons emitting from the photomask 21 and a gas introduction mechanism 23 for introducing an etching gas. An etching gas (a process gas effective for etching) can be maintained at a predetermined pressure in the chamber 20 and acts in concert with an electron beam to selectively etch a pattern film of the photomask 21.

The apparatus is further characterized in that the lens barrel 10 houses a plurality of apertures, e.g., shaping apertures 15 and 16 for flexibly controlling the shape of the beam projected on the surface of the photomask 21. Although the number of apertures is not particularly limited. Essentially required two apertures will be explained below. The first shaping aperture 15 is preferably rectangular. When electrons emitted from the electron gun 11 pass through the aperture 15, they are shaped into a rectangular. In this way, irradiation to an unnecessary region can be avoided. The rectangular-shaped beam is passed through the second shaping aperture 16 to shape into a specific figure and projected on the main surface of the photomask 21.

Figure 2:
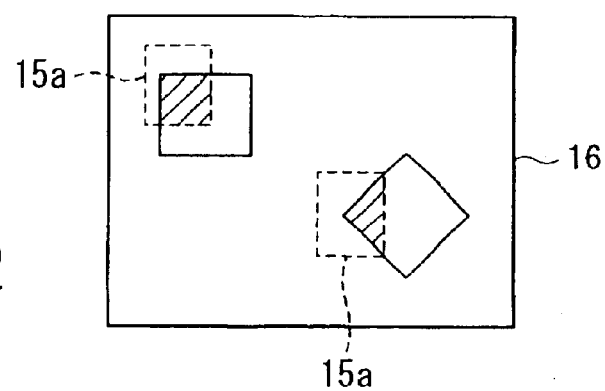
FIG. 2 shows apertures of a VSB system used in the first embodiment.

As shown in FIG. 2, assuming that the second shaping aperture 16 has a simple shape such as a square or rhombus, it is possible to form a rectangular or triangular beam by overlapping the aperture 16 with the projected image 15a obtained through the first shaping aperture 15. Furthermore, the beam size can be flexibly changed by varying the overlapping area. The beam thus controlled in shape and size (a variable shaped beam; VSB) is continuously applied along a non-defective pattern edge while changing the irradiation direction, thereby repairing a pattern even complicated.

How to repair patterns by the VSB system will be explained with reference to FIGS. 3A to 3C. In FIG. 3A, defective portions 33 and 34 are assumed to be present between adjacent nondefective patterns 31 and 32. These defective portions can be identified by scanning a converged fine electron beam in the proximity of the defective portions, as described later, and detecting the secondary electrons, thereby forming a secondary electron image. Subsequently, a beam pattern is formed by using a triangular beam 35 and a rectangular beam 36 in combination in accordance with the shapes of defective portions, as shown in FIG. 3B. Thereafter, an etching region including the defective portions is irradiated with the beam to remove the defective portions, as shown in FIG. 3C.

Next, the repair process of this embodiment will be explained more specifically with reference to the flowchart of FIG. 4.

First, in the apparatus shown in FIG. 1, an electron beam is converged to be fine by the electro optical system 10 and then a several-μm area including defective portions on the photomask 21 is scanned with the converged electron beam (Step S1). Subsequently, the secondary electrons emitted from the photomask 21 are detected to obtain a secondary electron image (Step S2). Incidentally, the beam is applied in this step in an extremely small current amount (dose) compared to that applied during the etch-process time.

With respect to the image thus taken, a secondary electron intensity profile is obtained in the direction perpendicular to the edge of a non-defective pattern. Based on peak positions, the positions corresponding to the edge of the non-defective pattern and the position corresponding to the edge of a defect are identified. In other words, a defective portion is identified (step S3). The aforementioned profiles are shown in FIGS. 5A to C. FIG. 5A is a plan view of a pattern image, FIG. 5B a sectional view of the pattern image, and FIG. 5C is a secondary electron profile. Secondary electron profiles obtained by scanning a position A and a position B differ from each other because of the presence or absence of a defect. Based of the difference, the position of defective portion can be specified.

Subsequently, a gas such as $F_2$, which is effectively used as an etching gas when a pattern forming film is etched by an excited electron beam, is introduced into the chamber 20 housing the photomask 21, and allowed to maintain the chamber 20 at a constant inner pressure (step S4). The conditions including pressure, substrate temperature, and the electron beam current amount, are appropriately selected so as to increase the etching rate to the pattern material and an etching selective ratio to a mask substrate.

For example, in the case of $F^2$, molybdenum silicide (MoSi) serving as a material for a phase shift mask can be etched at a rate of 190 nm/h by continuous irradiation of an electron beam at a current density of $3.2 \times 10^{-4}$ A/cm$^2$ while maintaining the inner pressure of the chamber 20 at 0.4 Pa. To further increase the etching rate, a local increase of the gas pressure of a beam irradiation region is considered effective. To increase the etching selective ratio, the addition of chlorine (Cl) or oxygen (O) is considered effective.

Figure 8A:
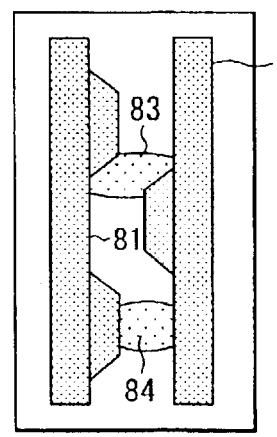
FIGS. 8A to 8C show the views for explaining a problem associated with a conventional system.
Figure 8B:
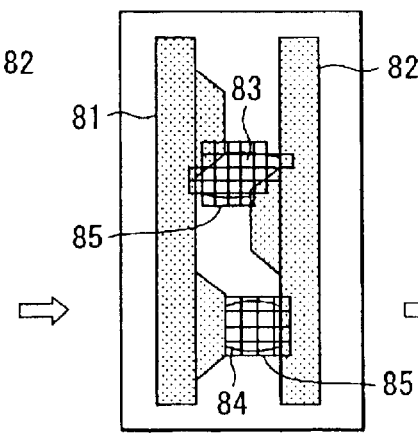
Figure 8C:

The electron beam is formed by the VSB system in accordance with the defective portion identified and the defective portion is irradiated by the electron beams thus formed (step S5). In other words, $F_2$ gas is introduced under the aforementioned conditions and simultaneously the shaped electron beam is applied as shown in FIG. 3B. In this manner, it is possible to prevent the formation of a stepped portion indicated by dots in FIG. 8.

The edge portion after the repair of a defect is determined depending upon the beam irradiation position. Besides this, a processing factor greatly affects the formation of the edge. This is because the defective portion is not only etched from the surface and but also from the side corresponding to the edge portion, thereby reducing in size. For example, when a beam is continuously applied even after etching reaches an end point, the etched surface is gradually dented by the tailing of the beam. To monitor such a process, the repair-process flow described later will be performed.

In the repair process, the irradiation may be performed in accordance with Cp (described later) or VSB. After a defective portion is irradiated with an electron beam for a predetermined time to allow etching to proceed, the electron beam is once converged to be fine and then scanned across a several μm area (step S6). Thereafter, a secondary electron image obtained by the beam scan is taken (step S7). Since the amount of beam current is regarded to be extremely low compared to that during the etching process, the pattern is rarely etched even it is placed in an etching gas atmosphere. Furthermore, with respect to the image taken, a secondary electron intensity profile is drawn in the direction perpendicular to the edge of a non-defective pattern. Based on the position of the peak, the position corresponding to the edge of the non-defective pattern and the position corresponding to the edge of the defect are detected (step S8).

Next, whether or not a defective portion disappeared is determined (step S9). If no defective portions are detected, the processing is terminated, whereas if a defective portion remains, a beam is reshaped in accordance with the size of the defect and then irradiation of the beam is performed again (step S10). Subsequently, S6 to S10 steps are repeated, in other words, a shaped beam irradiation process and observation process are repeated. When the side surface of the edge identified by the observation process comes to be a proper position, etching is stopped.

Figure 4:
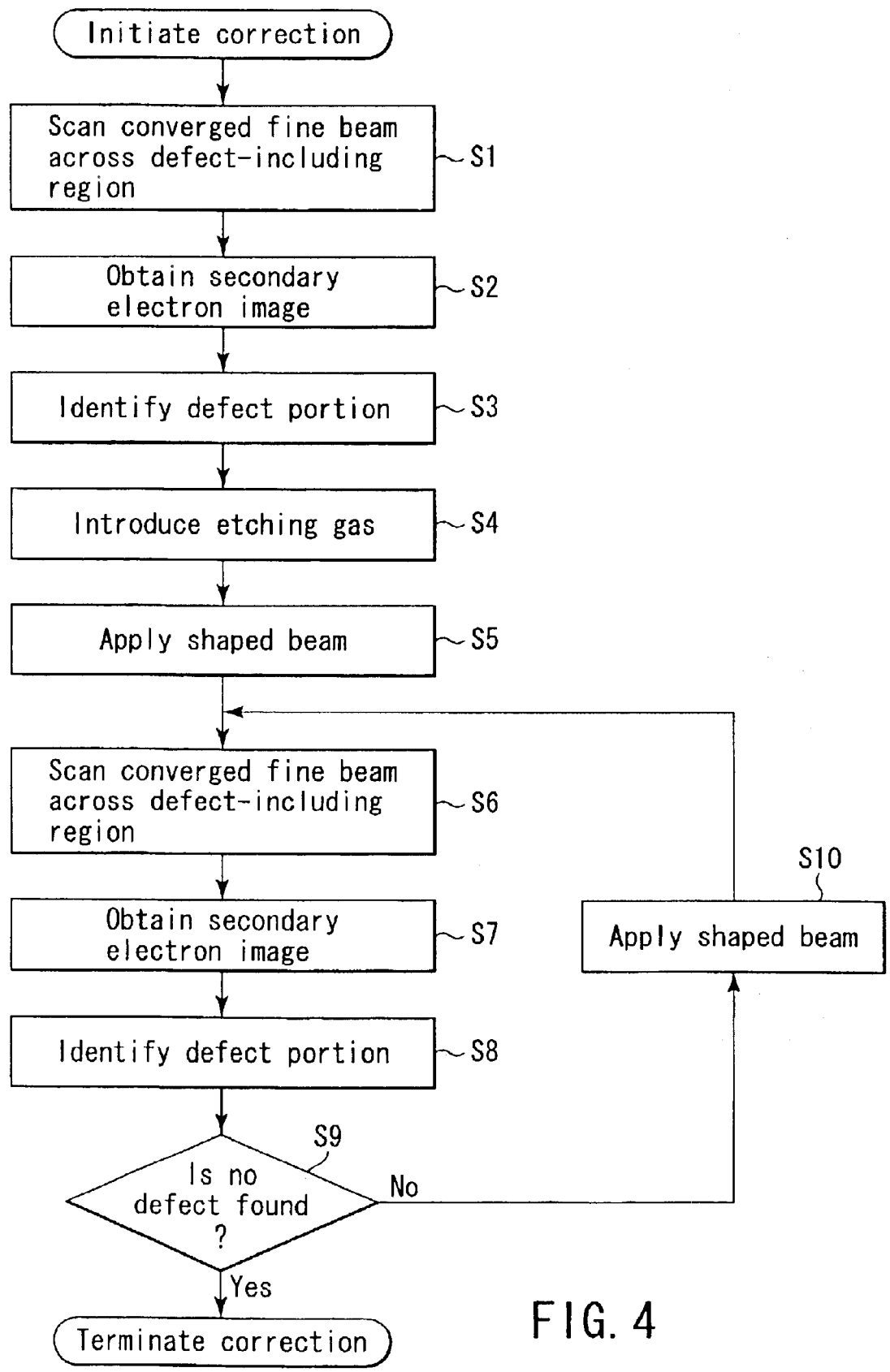
FIG. 4 is a flowchart for specifically explaining a repair procedure in the first embodiment.

The beam intensity in the shaped beams irradiation step S5 may be the same as that in step S10 in the flowchart of FIG. 4. Alternatively, it is possible that the beam intensity of the first beam irradiation step S5 is set to be high, and that of step S10 is set to be low. In this case, the total processing time may be reduced by increasing the intensity of a beam to be irradiated in the first beam irradiation step S5 within the range where excessive etching does not occur.

According to this embodiment, the shape and size of an etching region are set by using triangular and rectangular beams in combination in accordance with the VSB system, the formed beam is applied such that a side of the formed beam is set in parallel to the boarder line between a non-defective pattern and a defect in the boundary region between the non-defective pattern and the beam. Therefore, even if a defect is repaired along a diagonal line, the stepped portion is not formed. As a result, the same shape as the non-defective pattern having no roughness can be obtained. In addition, since not a converged fine beam but a shaped beam is used, a sufficient etching rate can be ensured while using an electron beam.

Furthermore, the irradiation width can be controlled not by changing a pixel size but by optically overlapping a plurality of shaping apertures. Therefore, an irradiation area can be set at a very fine pitch.

In this way, a bridge-form black defect is irradiated with a beam having a shape very close to the width of the defect pattern. When the shaping aperture is not used, the same results can be obtained if scanning is made by minimizing a beam size and a pixel size to the limits. However, the etching rate results in extremely low, so that much repair time is required.

Etching and monitoring of a defect are repeatedly performed and etching is stopped based on the monitoring results. In this way, observation can be made at a job site during processing. By feeding back the observation results to a beam irradiation position, the repair can be made with a higher accuracy. This is particularly effective when the beam is drifted by charge-up, and when the beam position shifts by a mechanical factor such as thermal expansion of a mask or a stage.

Since defects individually differ in size and thickness, the doses of the beam required for completely etching away the defects differ individually. When beam irradiation is continued after the defect is completely etched away, etching still proceeds due to the tailing of the beam, with the result that the etched surface is gradually dented. Therefore, the end point of the etching must be completely controlled; however, it is difficult to accurately determine whether etching is completed or not. Also, in this sense, the observation step must be sandwiched between process steps to check the position of the etching edge of a defect.

Since the observation step is provided between process steps, etching can be stopped in the middle before etching goes to the end if the irradiation range of the beam is significantly out of focus. It is therefore possible to reduce the probability of significant repair errors that is unable to be recovered. By use of the gas described above, etching can be made with a high selective ratio between the mask and the substrate and a vertical shape can be obtained after processing.

(Second Embodiment)

A second embodiment of the present invention will explained, in which a beam is shaped by using a character aperture in place of VSB.

The structure of the pattern-defect repair apparatus is principally the same as those shown in FIG. 1. However, the second shaping aperture 16 is neither a rectangular nor a rhombus but a reversed non-defective pattern. This is the same character aperture as used in forming a pattern.

Figure 6:
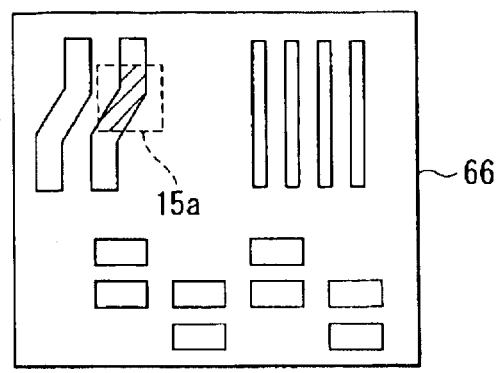
FIG. 6 is an aperture used in a CP system according to a second embodiment.

By using the character aperture of a second shaping aperture 66 (reversed pattern) and a projection image 15a of the first shaping aperture, in combination, as shown in FIG. 6, a synthesized figure corresponding to an etching region including a defective portion can be formed. As a result, the defective portion can be irradiated to repair by one operation without deflecting the beam. This method is called "character projection" (hereinafter referred to as "CP").

Figure 7A:
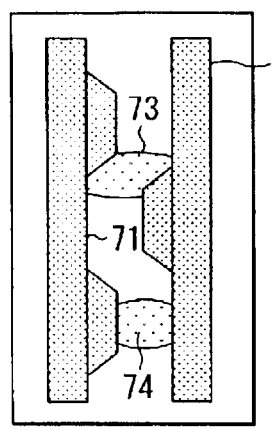
FIGS. 7A to 7C show a procedure how to repair a defect by the CP system.
Figure 7B:
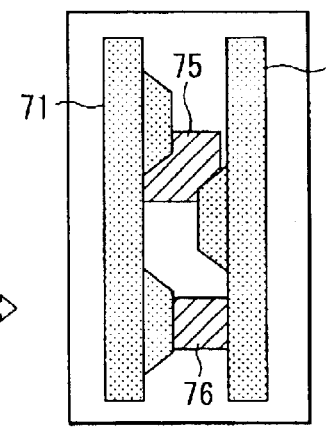
Figure 7C:
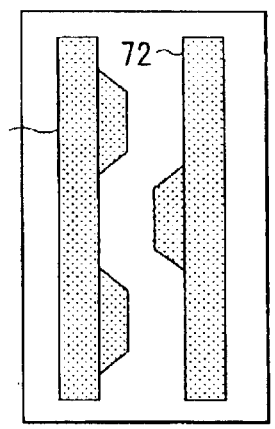

The case where repair is performed in accordance with the CP system is shown in FIG. 7A to 7C. As shown in FIG. 7A, defective portions 73 and 74 are assumed to be present between the adjacent non-defective patterns 71 and 72. These defective portions can be identified by scanning a converged fine electron beam across the region around the defective portions, and detecting secondary electrons to produce a secondary electron image. Subsequently, as shown in FIG. 7B, an etching region 75 is formed by using a rectangular aperture and a character aperture in combination and then irradiated with an electron beam by one operation. Similarly, an etching region 76 including a defective portion is formed by using a rectangular aperture and character aperture in combination and then irradiated with an electron beam by one operation. In this way, the defective portion can be removed as shown in FIG. 7C.

The repair process of this embodiment is substantially the same as that of the first embodiment explained in the flowchart of FIG. 4 except the shape of the beam to be applied to the etching region. Therefore, the same effect as that of the first embodiment can be obtained. Furthermore, since the etching region is irradiated by one operation, the throughput is better than that of the first embodiment.

Modified Example

The present invention is not limited to the aforementioned embodiments. The etching gas for a defective portion is not limited to $F_2$. Any gas may be used as long as the pattern material can be effectively etched by application of an excited electron beam.

Specific examples of the gas are a halogen gas such as $F_2$, $Cl_2$, $Br_2$, or $I_2$, a gas mixture of these, or a gas mixture in which a gas selected from $O_2$, $N_2$ and $H_2$ is further added to these gases. The structure of the pattern defect repair apparatus is not limited to that shown in FIG. 1. More specifically, the pattern defect repair apparatus may be any electron beam emitting apparatus capable of forming a shaped beam such as VSB or CP, as long as it further has a detecting mechanism for secondary electrons or reflection electrons from a photomask by beam scanning and a mechanism of introducing an etching gas into a chamber housing the photomask.

The pattern defect repair apparatus can be modified in various ways within the gist of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A photomask repair method for repairing a defect of a photomask, comprising:

scanning an electron beam across a main surface of the photomask, and detecting electrons emitted from the main surface of the photomask by scanning the beam, thereby producing a pattern image of the photomask;

identifying the position of a defective portion of the photomask from the pattern image thus produced; and etching the defective portion by applying an electron beam composed of shaped beams, which are formed through beam shaping apertures and projected to the main surface of the photomask, to a region to be etched including the defective region, under an atmosphere of a gas capable of effectively performing chemical etching of a film material for forming a pattern of the photomask, such that a side of the beam is applied in parallel to the boarder line between a non-defective pattern and the defect.

2. The method according to claim 1, wherein the region to be etched is a synthesized figure formed on the photomask by using a plurality of basic beams, such as a triangle or a rectangle in combination, which are obtained through a triangular or rectangular aperture; and individual basic beams are sequentially applied to the region to be etched to form the synthetic figure.

3. The method according to claim 2, wherein etching is allowed to proceed by repeatedly applying the plurality of basic beams to the region to be etched.

4. The method according to claim 1, wherein the region to be etched is a synthesized figure formed by combining a character aperture corresponding to a reversed pattern of the photomask and a rectangular aperture including the defective portion; and electron irradiation is performed to the region to be etched by one operation.

5. The method according to claim 4, wherein etching is allowed to proceed by repeatedly applying the beams having the synthesized figure to the region to be etched.

6. The method according to claim 1, wherein the gas capable of effectively performing chemical etching of a film material is a halogen gas or a gas mixture containing a plurality of halogen elements.

7. The method according to claim 6, wherein the halogen gas is one selected from the group consisting of $F_2$, $Cl_2$, $Br_2$ and $I_2$.

8. The method according to claim 1, wherein the gas capable of effectively performing chemical etching of a film material is prepared by adding one of $O_2$, $N_2$ and $H_2$ to the halogen gas or the gas mixture containing a plurality of halogen elements.

9. The method according to claim 8, wherein the halogen gas is one selected from the group consisting of $F_2$, $Cl_2$, $Br_2$ and $I_2$.

10. The method according to claim 1, wherein the acceleration voltage of the electron beam to be applied to the region to be etched is controlled such that an amount of electrons emitted from the main surface of the photomask after accelerated primary electrons reach the photomask, is equal to or larger than that of the primary electrons.

11. The method according to claim 1, wherein the electrons emitted from the main surface of the photomask are either secondary electrons or reflection electrons.

12. A photomask repair method for repairing a defect of a photomask; comprising:

applying an electron beam shaped trough a beam-shaping aperture to a region to be etched including a defective portion of the photomask under an atmosphere of a gas capable of effectively performing a chemical etching of a film material for forming a pattern of the photomask, thereby etching the defective portion;

scanning an electron beam converged to be fine across a predetermined area around the defective portion, thereby permitting secondary electrons to emit to produce a pattern image, obtaining an electron intensity profile in the perpendicular direction to an edge of the pattern image produced above, thereby identifying the position of the profile corresponding to an end of the defective portion; and performing repair of the photomask while performing etching and identification, repeatedly, and terminating the etching when the edge of the defective portion reaches a proper position.

13. The method according to claim 12, wherein, before the etching of the defective portion is performed, the electron beam is scanned across the main surface of the photomask and either secondary electrons or reflection electrons emitted from the main surface are detected to form a pattern image of the photomask, thereby identifying the defective portion of the photomask from the pattern image thus formed.

14. The method according to claim 12, wherein the gas capable of effectively performing chemical etching of a film material is a halogen gas or a gas mixture containing a plurality of halogen elements.

15. The method according to claim 14, wherein the halogen gas is one selected from the group consisting of $F_2$, $Cl_2$, $Br_2$ and $I_2$.

16. The method according to claim 12, wherein the gas capable of effectively performing chemical etching of a film material is prepared by adding one of $O_2$, $N_2$ and $H_2$ to the halogen gas or the gas mixture containing a plurality of halogen elements.

17. The method according to claim 16, wherein the halogen gas is one selected from the group consisting of $F_2$, $Cl_2$, $Br_2$ and $I_2$.

18. The method according to claim 12, wherein the acceleration voltage of the electron beam to be applied to the region to be etched is controlled such that an amount of secondary electrons emitted from the main surface of the photomask after accelerated primary electrons reach the photomask, is equal to or larger than that of the primary electrons.

* * * * *

UNITED STATES PATENT AND TRADEMARK OFFICE
CERTIFICATE OF CORRECTION

PATENT NO. : 6,991,878 B2
DATED : January 31, 2006
INVENTOR(S) : Kanamitsu et al.

It is certified that error appears in the above-identified patent and that said Letters Patent is hereby corrected as shown below:

Column 8,
Line 37, change "boarder line" to -- borderline --.

Column 9,
Line 16, change "photomask;" to -- photomask, --.
Line 17, change "trough" to -- through --.

Signed and Sealed this

Thirteenth Day of June, 2006

JON W. DUDAS
*Director of the United States Patent and Trademark Office*